United States Patent
Behr et al.

(10) Patent No.: US 10,431,715 B2
(45) Date of Patent: Oct. 1, 2019

(54) DEVICE AND METHOD FOR PRODUCING A DEVICE

(71) Applicant: OSRAM Opto Semiconductors GmbH, Regensburg (DE)

(72) Inventors: Barbara Behr, Abensberg (DE); Andreas Weimar, Regensburg (DE); Mathias Wendt, Hausen (DE); Marcus Zenger, Hausen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 18 days.

(21) Appl. No.: 15/754,959

(22) PCT Filed: Aug. 23, 2016

(86) PCT No.: PCT/EP2016/069892
§ 371 (c)(1),
(2) Date: Feb. 23, 2018

(87) PCT Pub. No.: WO2017/032773
PCT Pub. Date: Mar. 2, 2017

(65) Prior Publication Data
US 2019/0214525 A1    Jul. 11, 2019

(30) Foreign Application Priority Data

Aug. 25, 2015   (DE) .......................... 10 2015 114 088

(51) Int. Cl.
*H01L 33/00*   (2010.01)
*H01L 23/00*   (2006.01)
(Continued)

(52) U.S. Cl.
CPC .......... *H01L 33/0079* (2013.01); *H01L 24/29* (2013.01); *H01L 24/30* (2013.01);
(Continued)

(58) Field of Classification Search
None
See application file for complete search history.

(56) References Cited

U.S. PATENT DOCUMENTS 6,504,242 B1 *  1/2003  Deppisch ............ H01L 23/3735
                                                257/706
8,951,837 B2 *  2/2015  Chen .................... H01L 24/29
                                                257/E21.088
(Continued)

FOREIGN PATENT DOCUMENTS

DE    102011012262 A1    8/2012
DE    102013103081 A1   10/2014

OTHER PUBLICATIONS

Jellison, J.E., "Gold-Indium Intermetallic Compounds: Properties and Growth Rates," Materials Control and Applications Branch, Nov. 8, 1979, 45 pages.

(Continued)

*Primary Examiner* — Andres Munoz
(74) *Attorney, Agent, or Firm* — Slater Matsil, LLP

(57) ABSTRACT

A device and a method for producing a device are disclosed. In an embodiment the device includes a first component; a second component; and a connecting element arranged between the first component and the second component, wherein the connecting element comprises at least a first phase and a second phase, wherein the first phase comprises a first metal having a first concentration, a second metal having a second concentration and a third metal having a third concentration, wherein the second phase comprises the first metal having a fourth concentration, the second metal and the third metal, wherein the first metal, the second metal and the third metal are different from one another and are suitable for reacting at a processing temperature of less than 200° C., and wherein the following applies: $c11 \geq c25$ and $c11 \geq c13 \geq c12$.

16 Claims, 10 Drawing Sheets

(51) Int. Cl.
  *H01L 33/62* (2010.01)
  *H01L 33/32* (2010.01)
(52) U.S. Cl.
  CPC .............. *H01L 24/33* (2013.01); *H01L 24/83* (2013.01); *H01L 33/62* (2013.01); *H01L 33/32* (2013.01); *H01L 2224/29082* (2013.01); *H01L 2224/29084* (2013.01); *H01L 2224/29109* (2013.01); *H01L 2224/29111* (2013.01); *H01L 2224/29144* (2013.01); *H01L 2224/29155* (2013.01); *H01L 2224/29164* (2013.01); *H01L 2224/29166* (2013.01); *H01L 2224/29169* (2013.01); *H01L 2224/30505* (2013.01); *H01L 2224/32225* (2013.01); *H01L 2224/32245* (2013.01); *H01L 2224/33505* (2013.01); *H01L 2224/8381* (2013.01); *H01L 2224/83805* (2013.01); *H01L 2924/3511* (2013.01)

(56) References Cited

U.S. PATENT DOCUMENTS

| | | |
|---|---|---|
| 9,076,897 B2 | 7/2015 | Fischer et al. |
| 9,502,376 B2 | 11/2016 | Plößl |
| 2006/0249847 A1* | 11/2006 | Eriksen ................. C23C 14/021 257/751 |
| 2012/0068345 A1 | 3/2012 | Schmidt et al. |
| 2013/0037603 A1* | 2/2013 | Choi ................. H01L 23/49816 228/203 |
| 2013/0334561 A1 | 12/2013 | Lin et al. |
| 2014/0008801 A1* | 1/2014 | Chen ..................... H01L 24/29 257/751 |
| 2014/0077377 A1 | 3/2014 | Sasaki et al. |
| 2014/0137989 A1 | 5/2014 | Huang et al. |
| 2014/0239458 A1* | 8/2014 | Farooq .................... B32B 15/20 257/621 |
| 2014/0273318 A1* | 9/2014 | Ryu ..................... B23K 1/0006 438/26 |
| 2016/0027759 A1* | 1/2016 | Plößl ....................... H01L 24/29 257/741 |
| 2016/0346857 A1* | 12/2016 | Behr .................... B23K 1/0016 |
| 2018/0261564 A1* | 9/2018 | Behr ....................... H01L 24/29 |

OTHER PUBLICATIONS

Nicolet, M.A., "Diffusion Bafflers in Thin Films," Elsevier Sequoia, Thin Solid Films, vol. 52, Mar. 3, 1978, 15 pages.

* cited by examiner

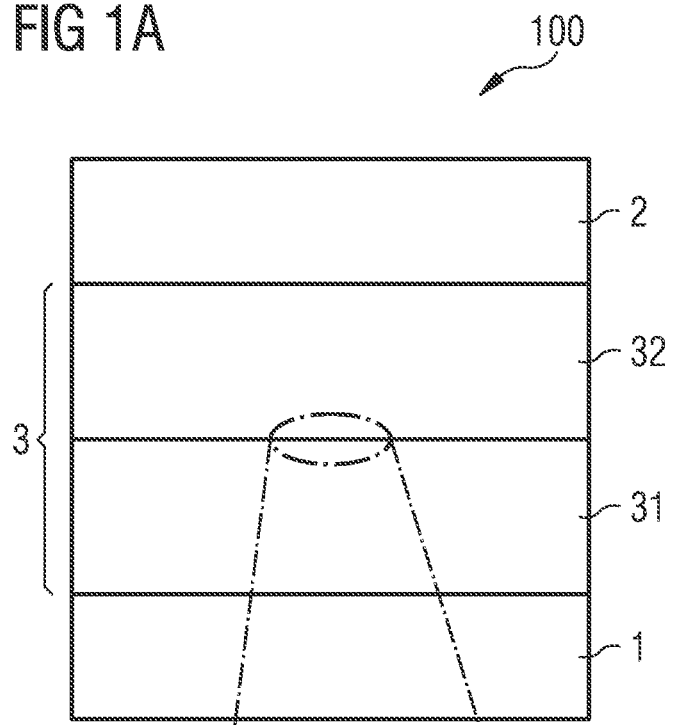
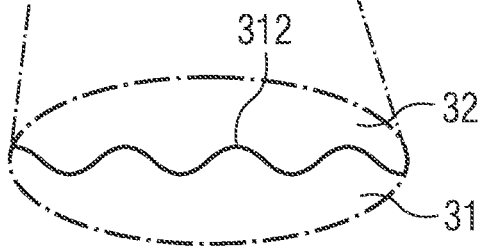

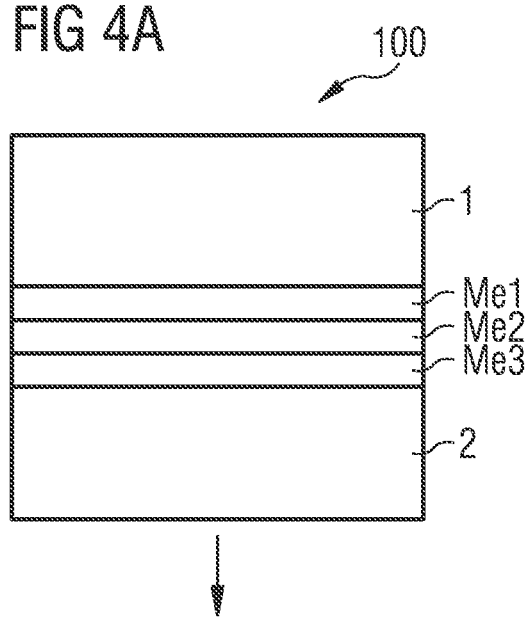
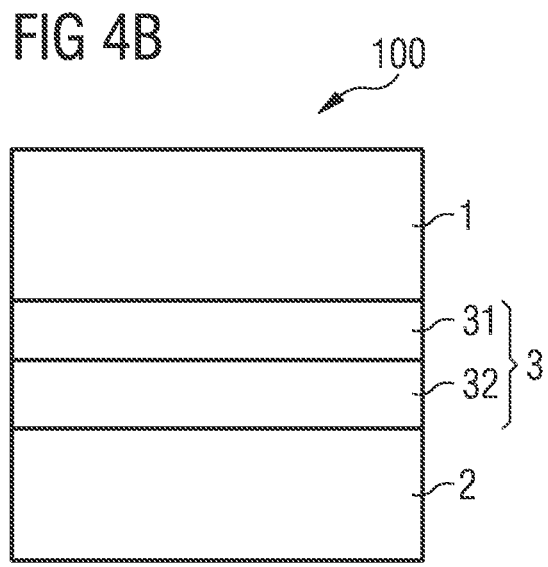

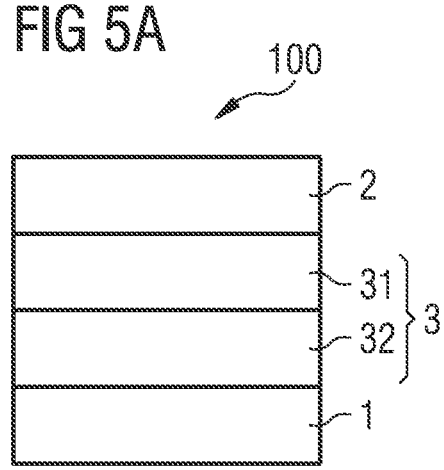
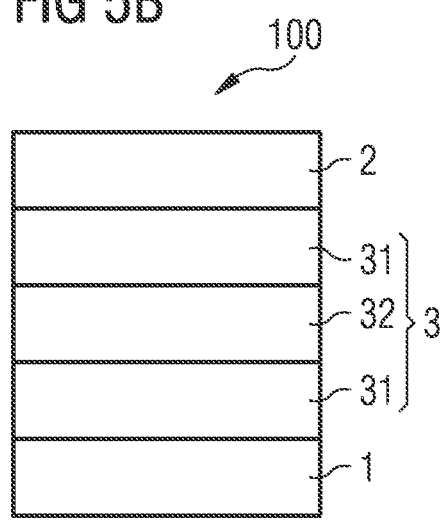

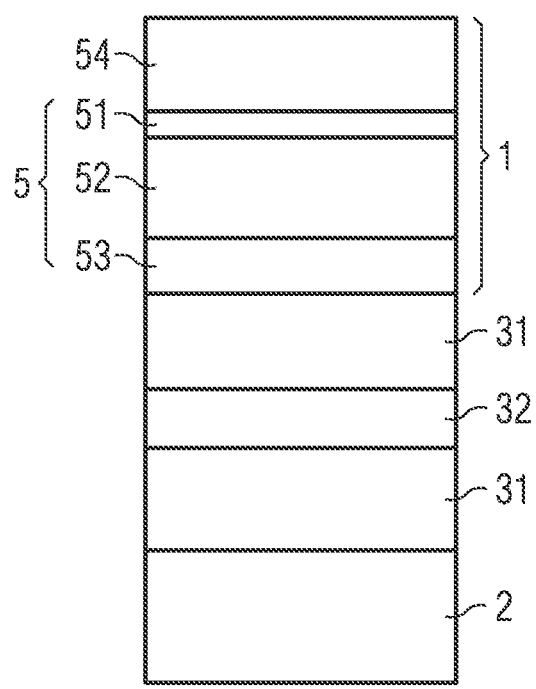

DEVICE AND METHOD FOR PRODUCING A DEVICE

This patent application is a national phase filing under section 371 of PCT/EP2016/069892, filed Aug. 23, 2016, which claims the priority of German patent application 10 2015 114 088.8, filed Aug. 25, 2015, each of which is incorporated herein by reference in its entirety.

TECHNICAL FIELD

The invention relates to a device and a method for producing a device.

BACKGROUND

The connecting or joining of at least two components is a challenge, in particular when both components have highly different coefficients of expansion. Components with highly different expansion coefficients generate in the composite a bending through, in particular when being exposed to higher temperatures, which leads to problems in the manufacture, to fracture as well as to loss of the functional capability of the components. To solve this problem, two approaches have usually been followed. On the one hand two components, for example, substrates, having a similar thermal expansion behavior, are used so that only a slight curve during the manufacturing of both components or substrates at a high fixing temperature occurs. On the other hand, attempts are being made to lower the fixing temperature by using low-melting metals, for example, indium, and their isothermal solidification reactions at mild temperatures. However, reducing the degree of bending is generally not enough in many practical applications as this can lead to brittleness or loss of the functional capability of the components.

SUMMARY OF THE INVENTION

Embodiments of the invention provide a device which is stable and/or is easy to manufacture. Further embodiments of the invention provide a method for producing a device which is easily produced and/or can be carried out cost-effectively.

In at least one embodiment, the device comprises a first component, a second component and a connecting element. The connecting element is arranged between the first component and the second component. The connecting element has at least one first phase and a second phase. The first phase comprises a first metal having a concentration c11, a second metal having a concentration c12 and a third metal having a concentration c13, or consists thereof. The second phase comprises the first metal having a concentration c25, the second metal, and the third metal, or consists thereof. The first metal, the second metal, and the third metal are different from one another and are suitable for mixing and/or reacting at a processing temperature of <200° C. The following applies: $c11 \geq c25$ and $c11 \geq c13 \geq c12$. The following applies in particular: $c11 \geq c25$ and $c11 0 c13 \geq c12$. "Reacting" means, in particular, that the metals chemically react.

According to at least one embodiment, the device comprises a first component and/or a second component. The first component and/or the second component can be made of a different number of materials and elements. The first and/or second component can be selected in each case, for example, from a group consisting of sapphire, silicon nitride, a semiconductor material, a ceramic material, a metal and glass.

For example, one of the two components can be a semiconductor or ceramic wafer, for example, a shaped material made of sapphire, silicon, germanium, silicon nitride, aluminum oxide, a luminescent ceramic, such as, for example, YAG. It is also possible that at least one component is embodied as a printed circuit board (PCB), as a metallic lead frame or as another type of connecting support. Furthermore, at least one of the components comprises, for example, an electronic chip, an optoelectronic chip, a light-emitting diode, a laser chip, a photo-detector chip, or has a plurality of chips of the aforementioned types. In particular the second component and/or first component comprise(s) a light-emitting diode, LED for short. In particular the second component includes the light-emitting diode, and the first component comprises at least one of the above-mentioned materials.

The component comprising the light-emitting diode is preferably designed to emit blue light or white light. Alternatively, the device can also emit other colors, for example, red, orange or radiation from the IR-region.

The light-emitting diode comprises at least one optoelectronic semiconductor chip. The optoelectronic semiconductor chip can have a semiconductor layer sequence. The semiconductor layer sequence of the semiconductor chip is preferably based on a III-V compound semiconductor material. For example, compounds from the elements consisting of indium, gallium, aluminium, nitrogen, phosphorus, arsenic, oxygen, silicon, carbon and combinations thereof. However, other elements and additions can also be used. The semiconductor layer sequence having an active region can be based, for example, on nitride compound semiconductor materials. In the present context, "based on nitride compound semiconductor material" means characterized in that the semiconductor layer sequence or at least a part thereof is a nitride compound semiconductor material, preferably $Al_nGa_mIn_{1-n-m}N$, or consists thereof, wherein $0 \leq n \leq 1$, $0 \leq m \leq 1$ and $n+m \leq 1$. This material does not necessarily have a mathematically exact composition according to the above formula. Rather, it can have, for example, one or more dopants and additional constituents. For the sake of simplicity, however, the above formula only contains the essential constituents of the crystal lattice (Al, Ga, In, N), even if these can be partially replaced and/or supplemented by small quantities of further substances.

The semiconductor layer sequence comprises an active layer having at least one pn-junction and/or having one or more quantum well structures. During operation of the LED or of the semiconductor chip, an electromagnetic radiation is generated in the active layer. A wavelength or a wavelength maximum of the radiation is preferably in the ultraviolet and/or visible and/or infrared spectral range, in particular at wavelengths between 420 and 800 nm inclusive, for example, between 440 and 480 nm inclusive.

According to at least one embodiment, the first component differs from the second component in terms of its composition. For example, the first and the second component have different coefficients of thermal expansion. In other words, the component has two components which differ from one another at least in their coefficient of thermal expansion.

According to at least one embodiment, the first component has a first coefficient of thermal expansion a1. The second component has a second coefficient of thermal expansion c2. In particular, the first coefficient of thermal expansion a1 is different from the second coefficient of thermal expansion c2. In particular, both thermal expansion coefficients differ by at least a factor of 3, 2, 1 or 1.5, or alternatively $\alpha 1 = \alpha 2$.

According to at least one embodiment, the device has a connecting element. The connecting element is arranged between the first component and the second component. In other words, the connecting element connects the first and the second component to one another. For example, the connecting element can be a mechanical connection between the first component and the second component. Furthermore, an electrical connection of the first component to the second component can also be effected via the connecting element. In particular, the connecting element is arranged in direct mechanical and/or electrical contact with the first component and the second component.

According to at least one embodiment, the connecting element is a connecting layer or has a plurality of connecting layers.

The connecting element comprises at least two phases, a first phase and a second phase. In particular, the connecting element consists of the first phase and the second phase. The connecting element can also have more than two phases, for example, three, four or five phases. The connecting element can also have a plurality of first phases and/or a plurality of second phases. In particular, the plurality of first phases are spatially separated from one another. For example, two first phases can be spatially separated from one another by a second phase. The at least first phase and/or the at least second phase differ at least in terms of their composition. If, for example, the connecting element consists of three phases, two identical first phases and the second phase can be present.

The respective phases can also form sub-phases. In particular, the sub-phases do not form a uniform layer. In particular, each phase consists of different grains, the composition of which is in the specified range. However, the composition can be different from grain to grain. A sub-phase thus forms within the first and/or second phase, which has no layer having a homogeneous layer thickness.

In this case, "phase" means a region of the connecting element in which similar or identical physical properties, for example, the melting point, are present.

According to at least one embodiment, the respective phases of the connecting element have different types of metal. In particular, the metals differ from one another within the corresponding phases. For example, the connecting element has at least three or four different metals in the first phase, a first metal Me1 having a concentration c11, a second metal Me2 having a concentration c12, a third metal Me3 with a concentration c13 and optionally a fourth metal Me4 with a concentration c14. In particular, the first phase consists of said metals. The second phase can likewise have or consist of different types of metal. For example, the second phase can comprise or consist of the same first metal Me1 containing in the first phase, the same second metal Me2 containing in the first phase and the same third metal Me3 containing in the first phase. Alternatively or additionally, further metals, for example, a fourth metal Me4, can also be present in the second phase. In particular, the first metal Me1 of the first phase differs from the first metal Me1 of the second phase by its concentration within the corresponding phases. In particular, the concentration of the first metal in the first phase is greater than or equal to the concentration of the first metal in the second phase (c11≥c25). In particular, the concentrations of the metals also differ within the phase, for example, the concentration of the first metal in the first phase is greater than or equal to the concentration of the third metal in the first phase (c11≥c13) and greater than the concentration of the second metal in the first phase (c11≥c12). The concentration of the third metal in the first phase is greater than the concentration of the second metal in the first phase, so that the following applies: c13>c12.

According to at least one embodiment, the first and/or second phase is/are a ternary system. In other words, the first and/or second phase consist(s) of the three metals, the first metal, the second metal and the third metal. In particular, the first and/or second phase has/have low-melting metals.

According to at least one embodiment, the first and/or second phase each consist of the first metal, the second metal, the third metal and a fourth metal. In particular, the metals have different concentrations in the corresponding phases, so that the first and/or second phase has/have different compositions.

In particular, the corresponding metals form an alloy in the corresponding phases.

According to at least one embodiment, the first metal, the second metal and the third metal are suitable for mixing or reacting at a processing temperature of <200° C., in particular of less than 180° C. This can be achieved, for example, by that, at a processing temperature of <200° C. or <120° C., the second metal and the third metal form a liquid aggregate state and react with a solid first metal. This results in a first phase and/or a second phase, which has/have a different concentration compositions of the corresponding metals.

According to at least one embodiment, the second metal has a concentration c12 in the first phase, and the third metal has a concentration c13 in the first phase. In particular, the second metal has a concentration c26 in the second phase, and the third metal has a concentration c27 in the second phase. The following applies: c11>c25 and c11>c13>c12 and c12<c26 or c11>c25 and c11>c13>c12 and c25=c27>c26. The following applies in particular: c11>c25 and c11>c13>c12 and c12<c26 or c11>c25 and c11>c13>c12 and c25≈c27>c26. In this case "≈" means that the values differ from one another by a maximum of 10%, in particular 2 or 5%.

According to at least one embodiment, the first metal is selected from a group comprising nickel, platinum and palladium. The first metal is preferably nickel, since it can be made available more cost-effectively.

According to at least one embodiment, the second metal is indium.

According to at least one embodiment, the third metal is tin.

According to at least one embodiment, the concentration c11 of the first metal in the first phase is between 40 atom % and 65 atom % inclusive, in particular between 45 atom % and 60o atom % inclusive, for example, 50 atom %. Alternatively or additionally, the concentration c25 of the first metal in the second phase is between 20 atom % inclusive and 40 atom % inclusive, in particular between 25 atom % and 35 atom %, for example, 30 atom %.

According to at least one embodiment, the concentration c12 of the second metal in the first phase is between 5 atom % and 25 atom % inclusive, in particular between 8 atom % and 20 atom % inclusive, for example, 15 atom %. Alternatively or additionally, the concentration c26 of the second metal in the second phase is between 20 atom % inclusive and 40 atom % inclusive, in particular between 20 atom % and 35 atom % inclusive, for example, 30 atom %.

According to at least one embodiment, the concentration c13 of the third metal in the first phase is between 15 atom % inclusive and 40 atom % inclusive, in particular between 20 atom % and 40 atom % inclusive, for example, 30 atom %. Alternatively or additionally, the concentration c27 of the third metal in the second phase is between 30 atom % inclusive and 50 atom % inclusive, in particular between 30 atom % and 45 atom %, for example, 35 atom %

The concentrations were determined by means of EDX (Energy dispersive x-ray spectroscopy), which can have an error tolerance of at most 5%, in particular a maximum of 2%.

In particular, the concentrations of the first metal in the first phase can be arbitrarily combined with the concentrations of the second metal in the first phase and with the concentrations of the third metal in the first phase. In particular, the concentrations of the first metal in the second phase can be arbitrarily combined with the concentrations of the second metal in the second phase and with the concentrations of the third metal in the second phase.

According to at least one embodiment, the first metal has a melting point of >1400° C. The second metal has a melting point of less than 180° C. The third metal has a melting point of 250° C. For example, nickel having a melting temperature of 1455° C., platinum having a melting temperature of 1768° C. and/or palladium having a melting temperature of 1555° C. can be used as the first metal. For example, indium having a melting temperature of 156° C. can be used as the second metal. For example, tin having a melting temperature of 231° C. can be used as the third metal.

Alternatively or additionally, the second and the third metal can be a eutectic mixture at a melting point of less than or equal to 120° C., in particular ≤118° C. In particular, the second and the third metal form a eutectic mixture having a melting temperature between 115° C. and 118° C. For example, if indium and tin are selected as the second and third metals, indium having a content of 52 atom % and tin having a content of 48 atom % forms an eutectic at a melting temperature of 117.5+/−0.5° C. The combination of the second metal with the third metal having a low melting point has the advantage that the connecting element is produced at low processing temperatures and thus a composite of at least two components having different coefficients of thermal expansion can be produced at low processing temperatures.

According to at least one embodiment, the first and/or the second phase has/have a further metal, in particular a fourth metal Me4. The fourth metal has a concentration c14 in the first phase. Alternatively or additionally, the fourth metal has a concentration c28 in the second phase. The fourth metal has, in particular, a melting point of less than 1200° C. The concentration of the fourth metal in the first and/or second phase is preferably the smallest concentration of all metals, in particular smaller than the concentrations of the first, second and third metals.

According to at least one embodiment, the fourth metal is gold. In particular, gold has a melting point of 1064° C.

According to at least one embodiment, the concentration of the fourth metal in the first and/or second phase is at most 5 atom %. In particular, the first phase and/or the second phase can also be free of noble metals, in particular of gold. The concentration of the fourth metal in the first and/or second phase can therefore be between 0 atom % and 5 atom %. The gold can in particular be incorporated into the atomic gratings of the first and/or second phase. Gold on the starting layers of the first and/or second and/or third metal prevents oxidation of these metal layers. In particular, the concentration of the fourth metal, for example, gold, should not be higher than 5 atom %, in order to prevent the formation of an undesirable phase, for example, an $AuIn_2$-phase.

According to at least one embodiment, the first phase and/or the second phase are each formed as a layer. The layer can in particular have a layer thickness of 30 nm to 10 000 nm, for example, 100 nm to 2000 nm. The first and/or second phases formed as layers are arranged in particular in direct contact, which means in direct mechanical and/or electrical contact. In particular, the layers of the first and second phases are stacked one on top of the other in a side view onto the device, so that the first phase of the first component is directed towards the second phase of the second component. Alternatively or additionally, the respective layers of the first and second phases are stacked one on top of the other, so that the first phase of the second component is directed towards the second phase of the first component. In particular, the first phase is then arranged in direct mechanical or electrical contact with the second component and the second phase is arranged with the first component in direct mechanical and/or electrical contact with one another.

According to at least one embodiment, the surface of the first phase layer and/or of the second phase layer is shaped in a wave shape. In particular, the adjoining surfaces of the first and second phase layers are shaped in a wave shape. In other words, the surface of the respective phase layer is not planar, but the phase layers mesh with one another due to their wave shape. The wave-shaped configuration can be produced in particular by grains of different sizes.

The inventors have recognized that the connecting of the first and second components, for example, the bonding of wafers, with greatly different coefficients of expansion at mild temperatures, is possible by using the inventive first phase and/or second phase of the connecting element, so that these components have a low degree of bending after bonding, for example, after bonding. In addition, the connecting element according to the invention has a thermo-mechanical stability, so that the component is also outstandingly suitable for subsequent processes and for the operation of the device.

If, for example, two components having different coefficients of thermal expansion are fixed on top of one another in a planar manner at elevated temperature and are subsequently cooled, a bending of the component is produced due to the different contraction of the two components, for example, of wafers. This effect is comparable to that of a bimetal strip. This resulting mechanical stress is due to the different large coefficients of thermal expansion of the first and second components. These further contribute to an internal stress in the rest of the device. The bending of the device can have a negative effect both during production and on the component life. For example, the components in the device can also lose their functionality or break during production. This results in high yield losses.

The connecting element according to the invention makes it possible to use inexpensive components, for example, substrates having low thermal expansion coefficients, as a result of the great reduction in the processing temperature without entailing a high degree of bending of the components. Thus, for example, a component made of silicon, quartz glass or silicon nitride having a low coefficient of thermal expansion (Si: $2.6·10^{-6}$ $K^{-1}$, quarz glass: $0.54·10^{-6}$ $K^{-1}$, Si3N4: $1.2·10^{-6}$ $K^{-1}$), together with a component made of sapphire ($6.1·10^{-6}$ $K^{-1}$) or GaAs, which have a high coefficient of thermal expansion, present in the component are connected to one another without any significant bow occurring. The occurrence of the component fracture is avoided or reduced by the use of a connecting element according to the invention. Furthermore, the use of nickel makes it possible to dispense with the use of noble metals, for example, gold, in the device. This leads to cost savings.

According to the invention, in particular a ternary low-melting metal system is proposed as the first and second phases, which is capable of connecting or fixing the components to one another at low temperatures. In a further temperature step, the complete reaction of the connecting element can be achieved and thus a thermomechanically stable connecting element can be formed.

In particular, the eutectic of the second and third metals, for example, the metals indium and tin, can be used, in order to reduce the melting point of the mixture and thus to reduce the processing temperature. The device can thus be produced at lower temperatures. During the joining of the two components, in particular the melt of the second and third metals reacts with the first metal of the ternary system, in particular nickel, palladium or platinum, to a ternary intermetallic layer, which already fixes the processing temperature. In a further temperature step, the first and/or second phase can be reacted. Here, the layers consisting of the ternary phases accumulate with the first metal by solid-state diffusion mechanisms. In other words, a remelting of the connecting element is prevented and a temperature-stable and mechanically stable connecting element is produced. After production, the connecting element shows a composition comprising at least a first phase and at least one second phase, which has a different concentration of the individual metals. The phases have increased remelting points in comparison to the melting points of the low-melting second and third metals, for example, indium and tin.

The invention further relates to a method for producing a device. The method for producing the device preferably produces the device. This means that all the features disclosed for the method are also disclosed for the device and vice versa.

According to at least one embodiment, the method comprises the following steps:

A) providing a first component and/or a second component,

B) applying a layer of a first metal Me1, a layer of a second metal Me2 and a layer of a third metal Me3 onto the first and/or second component. In particular, the layer of the first metal has a layer thickness of 10 nm to 3000 nm. The layer of the second metal has a layer thickness of 10 nm to 3000 nm. The layer of the third metal has a layer thickness of 10 nm to 4000 nm.

C) heating the arrangement generated in step B) to a first temperature, for example, at most 200° C. or 180° C. in order to form a connecting element. The connecting element has a first phase and a second phase. The first phase and the second phase each comprise at least the first metal, the second metal and the third metal or consist thereof. In particular, the first metal, the second metal and/or the third metal have a different concentration in the first or second phase, so that the first phase and the second phase have a different composition.

D) heating the arrangement generated in step C) to a second temperature, by way of example to a temperature between 200° C. and 400° C., for forming a thermodynamically and mechanically stable first and second phase, wherein at least before step D) the first and second components are connected to one another, wherein the first phase, at least after step D), comprises the first metal Me1 with a concentration $c11$, the second metal Me2 with a concentration $c12$ and the third metal Me3 with a concentration $c13$, and the second phase comprises the first metal Me1 with a concentration $c25$, the second metal Me2 with a concentration $c26$ and the third metal Me3 with a concentration $c27$, or consists thereof. The following applies: $c11 \geq c2_5$ and $c11 \geq c13 > c12$, in particular $c11 > c25$ and $c11 > c13 > c12$. In particular, the components are brought into contact with one another such that the applied layers lie directly on top of one another.

The term "thermodynamically and mechanically stable" means here and below that the first metal is mixed with the second metal and the third metal in such a way that the first and/or second phases do not accumulate further with the first metal and the first and/or second phases have a solid state of aggregation. In particular, after step D), the first and/or the second phase have a melting temperature which differs from the melting temperature of the first and/or second phase before step D), for example, in the first and second phases in step C). In particular, the remelting temperature of the first and/or second phase after step D) is greater than the remelting temperature of the first and/or second phase before step D), for example, in step C).

According to at least one embodiment, the connecting element forms at least in step C) a fixed connection to the first component and the second component.

According to at least one embodiment, a further step C1 is carried out between step C) and D):

C1) cooling the arrangement generated in step C) to room temperature. A temperature of 25° C. is understood here in particular as room temperature.

According to at least one embodiment, the first and/or second phases have a composition such that bending of the first and/or second component is minimized.

According to at least one embodiment of the method, the first and/or second components are heated up to a first temperature, for example, up to a first temperature of at most 200° C. or at most 180° C. The first metal and the second metal and the third metal thus form a ternary first and/or second phase. In particular, the second and the third metal melt on account of their suitability for forming a eutectic and react with the first metal to form a ternary first and/or second phase. The ternary first or second phase comprises or consists of the first, second and third metals. The ternary phase can be a multi-phase intermetallic layer. In the component, these ternary phases then connect the first and second components to one another. In particular, the components have different coefficients of thermal expansion.

The method enables the connection of a first component to a second component by means of a connecting element, wherein the two components have, in particular, different coefficients of thermal expansion. This allows the use of cheaper materials for the first and/or second component in order to form a device. Thus, for example, thermally and electrically highly conductive and expensive materials, such as silicon wafers, can be used for connecting to a sapphire wafer.

BRIEF DESCRIPTION OF THE DRAWINGS

Further advantages, advantageous embodiments and developments will become apparent from the exemplary embodiments described below in conjunction with the figures.

The figures show:

FIG. 1A shows a schematic side view of a device according to an embodiment;

FIG. 1B shows a detailed view of FIG. 1A;

FIGS. 2A to 2B, FIGS. 3A to 3B, FIGS. 4A to 4B and FIGS. 5A to 5B show schematic side views of a device according to an embodiment; and FIGS. 6A to 6C, FIGS. 7A to 7C, FIGS. 8A to 8B and FIGS. 9A to 9B show a method for producing a device according to an embodiment.

Figure 2A:
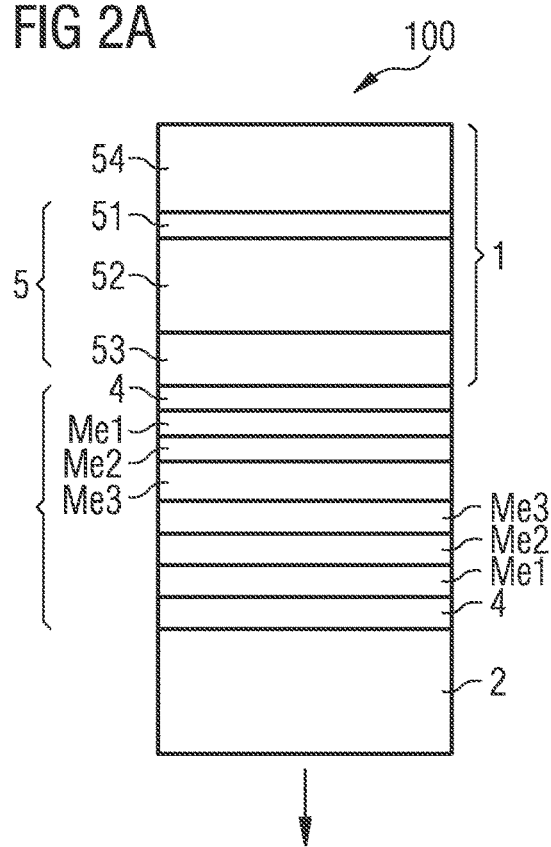

In the exemplary embodiments and figures, identical or identically acting elements can in each case be provided with the same reference symbols. The elements illustrated and their size relationships among one another are not to be regarded as true to scale. Rather, individual elements such as, for example, layers, components, devices and regions are represented with an exaggerated size for better representability and/or for a better understanding.

DETAILED DESCRIPTION OF ILLUSTRATIVE EMBODIMENTS

FIG. 1 shows a schematic side view of a device 100 according to an embodiment. The device 100 has a first component 1 and a second component 2. A connecting element 3 is arranged between the first component 1 and the second component 2. The first component 1 and the second component 2 are selected, for example, from a group of: sapphire, a ceramic material, a semiconductor material and a metal. In this case, the first component 1 and the second component 2 can be selected in such a way that they have different coefficients of thermal expansion. In particular, their coefficients of thermal expansion differ at least by a factor of 1.5, for example, by a factor of 3 or higher.

The connecting element 3 is arranged between the first component 1 and the second component 2. The connecting element 3 is in direct contact with the first component 1 and the second component 2. The connecting element 3 has a first phase 31 and a second phase 32.

For example, the first phase 31 consists of or comprises the following metals with the concentrations:
First metal Me1: 45 to 60 atom %,
Second metal Me2: 8 to 20 atom %,
Third metal Me3: 20 to 40 atom %,
Fourth metal Me4: 0 to 5 atom %

The second phase 32 can consist of or comprise the following metals and their concentrations:
First metal Me1: 25 to 35 atom %,
Second metal Me2: 20 to 35 atom %,
Third metal Me3: 30 to 45 atom %,
Fourth metal Me4: 0 to 5 atom %.

In other words, the connecting element has two phases 31, 32, wherein each phase 31, 32 comprises or consists of at least three metals Me1, Me2, Me3. In this case, the concentration ell of the first metal Me1 in the first phase is greater than the concentration c25 of the first metal Me1 in the second phase, and the concentration c11 of the first metal Me1 in the first phase is greater than the concentration c13 of the third metal Me3 in the first phase and is greater than the concentration c12 of the second metal Me2 in the first phase. For example, nickel, platinum and/or palladium can be used as the first metal Me1. Indium, for example, can be used as the second metal Me2. Tin, for example, can be used as the third metal Me3, and optionally gold can be used as the fourth metal Me4. In particular, the fourth metal Me4 has the lowest concentration of all metals in the corresponding phase 31, 32.

According to at least one embodiment, the first phase 31 and/or the second phase 32 are each formed as a layer. In particular, the first and/or second phases 31, 32 are stacked one on top of the other. The interfaces between adjacent layers of the first and/or second phases 31, 32 can be planar. Alternatively, as shown in FIG. 1B, the interfaces 312 between the first phase 31 and of the second phase 32 are not planar but have a wave shape. As a result, the first phase 31 can be interlocked with the second phase 32. This can be caused by the individual growth of the grains in the respective layer.

Figure 2B:
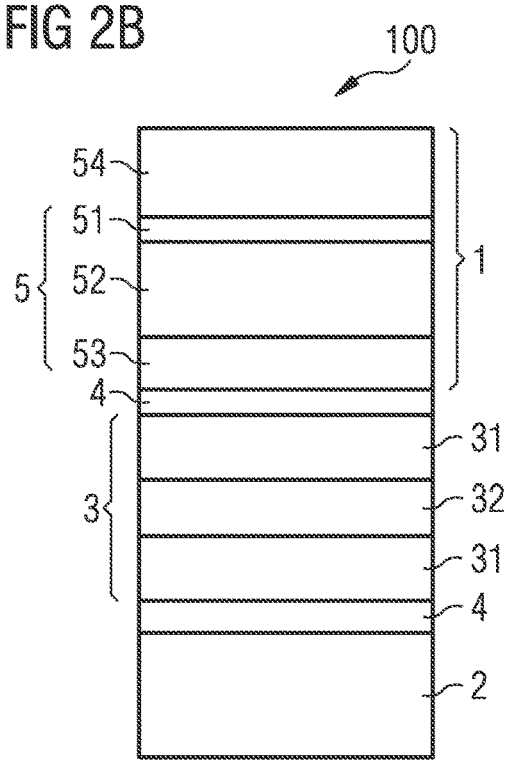

FIGS. 2A and 2B each show a device 100 according to an embodiment and the production thereof. The device of FIG. 2A shows an arrangement of device 100 before the influence of the temperature, that is to say before method steps C) and D) have been applied. FIG. 2B shows the finished device 100 according to at least method step C) and/or D).

FIG. 2A shows a first component 1, which consists of a layer sequence. The first component 1 has a substrate 54, which can be, for example, a sapphire substrate of a light-emitting diode. A semiconductor layer sequence 5 can be applied on or below the sapphire substrate. The semiconductor layer sequence 5 comprises an n-type semiconductor layer 51, an active layer 52 and a p-type semiconductor layer 53. The active layer 52 is able to emit, during operation, radiation in particular from the visible wavelength range. The semiconductor layer sequence 5 can be grown, for example, by MOCVD processes. Alternatively, in this case and in the following, the n-type semiconductor layer 51 and the p-type semiconductor layer 53 can be interchanged.

The second component 2 can be, for example, a wafer made of an insulating ceramic material, for example, a silicon nitride wafer. Alternatively, the second component 2 can be a quartz glass. The linear coefficient of thermal expansion of the sapphire substrate is approximately 6.1 μm/(mK) and the linear thermal expansion coefficient of the second component 2 of the ceramic material is approximately 1.2 μm/(mK). The first component 1 and the second component 2 thus have different thermal expansion coefficients, which differ from each other by at least a factor of 5. This difference in the coefficients of thermal expansion of sapphire and the ceramic material is too large and would lead to a strong bending of the composite during production and thus destroy the device under certain circumstances. This would also be achieved if, for example, a gold-indium or gold-tin alloy were used as the connecting element 3. The problem is solved by using the connecting element 3 according to the invention.

In particular, the connecting element 3 comprises a first and a second phase 31, 32, as shown in FIG. 2B. FIG. 2B shows a connecting element 3 which comprises three phases 31, 32, 31. It comprises two first phases 31, which are spatially separated from one another by a second phase 32. In particular, the compositions of the first phases are the same, while the composition of the first phases 31 differs from the composition of the second phase 32. The first and second phases 31, 32 comprise at least one first metal, a second metal and a third metal, wherein the metals differ from one another. The concentration of the individual metals in the first and second phases 31, 32 is different. In particular, the concentration c11 of the first metal Me1 in the first phase 31 is greater than the concentration c25 of the first metal Me1 in the second phase. The concentration c11 of the first metal Me1 in the first phase can be equal to the concentration c11 of the first metal Me1 in the further first phase 31.

The connecting element 3 is arranged between the two components 1, 2. An adhesive layer 4 can be arranged on one or both sides between the connecting element 3 and the components 1, 2. The adhesive layer 4 can comprise or consist of, for example, platinum, gold or titanium. Alternatively, the adhesive layer 4 can also not be present in the device 100.

Figure 3A:
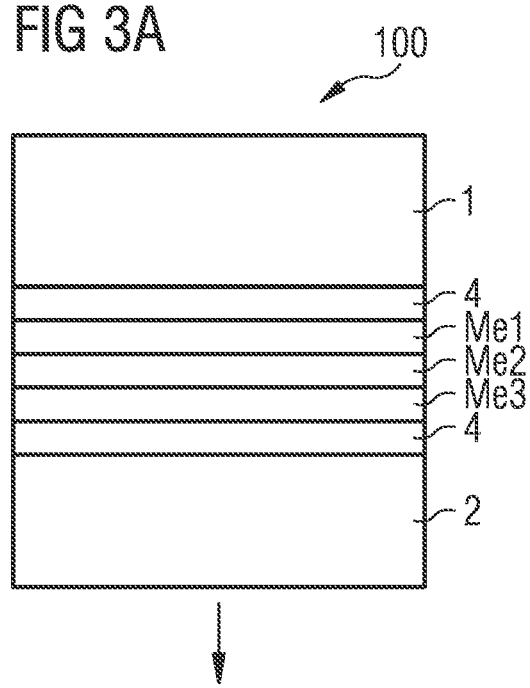
Figure 3B:
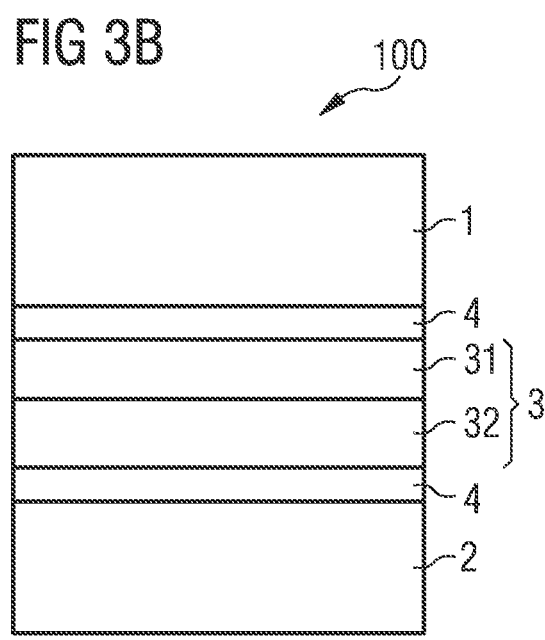

FIGS. 3A and 3B each show a schematic side view of a device 100 according to an embodiment. FIG. 3A shows the device 100 before the connecting element 3 is formed.

FIG. 3B shows the final device 100, that is to say the device at least after step D). FIG. 3A shows that between the two components 1, 2 and between two adhesive layers 4 three metallic layers Me1, Me2 and Me3 are arranged. The adhesive layers 4 can also be absent. The layer Me1 comprises the first metal. The layer Me2 comprises the second metal. The layer Me3 has the third metal. After being exposed to the first temperature and/or second temperature in method steps C) and D), a device 100 according to FIG. 3B results. In other words, the individual metallic layers are converted to a first and/or second phase 31, 32. The first phase 31 comprises the first metal Me1, the second metal Me2 and the third metal Me3. The second phase 32 also comprises the first metal Me1, the second metal Me2 and the third metal Me3. In this case, the phases 31, 32 differ from one another by the concentrations of the individual metals.

FIGS. 4A and 4B each show a schematic side view of a device according to an embodiment. FIG. 4A shows the device 100 before the connecting element 3 is formed.

FIG. 4B shows the final device 4B at least after method step D). FIGS. 4A and 4B differ from each other and from FIGS. 3A and 3B in such a way that no adhesive layer 4 is arranged between the metallic layer Me1 and the first component 1 and between the metallic layer Me3 and the second component 2. This results in a device 100 which comprises the following layer sequence: first component 1, first phase 31, second phase 32 and second component 2 (see FIG. 4B).

FIG. 5A shows a schematic side view of a device 100 according to an embodiment. FIG. 5A differs from FIG. 4B in that the first phase 31 of the connecting element 3 faces the second component 2. The second phase 32 of the connecting element 3 faces the first component 1. In comparison thereto, FIG. 4B shows that the first phase 31 faces the first component 1 and the second phase 32 faces the second component 2.

FIG. 5B shows a schematic side view of a device according to an embodiment. The device 100 of FIG. 5B differs from the device of FIG. 5A in that the device 100 of FIG. 5B has an additional first phase 31. A device 100 which has a symmetrical structure can thus be produced. In particular, the respective first phases 31 have a higher concentration c11 of the first metal Me1 than the second phase 32.

Figure 6A:
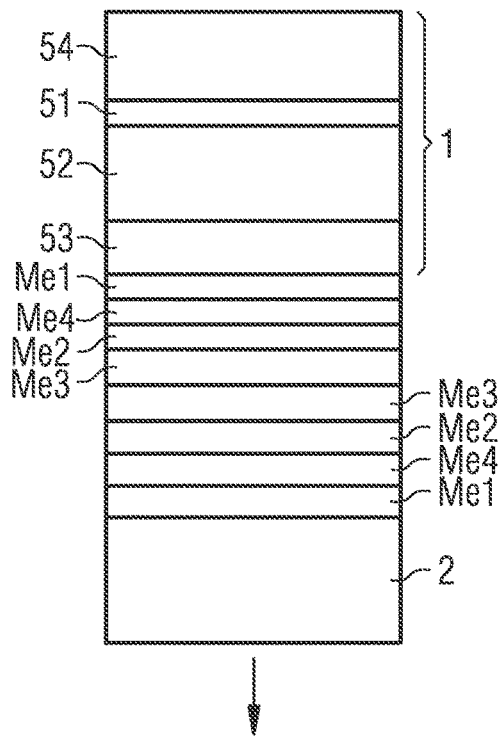

FIG. 6A shows a method for producing a device according to an embodiment. FIG. 6A shows, for example, that on the side of the first component 1, a layer made of a first metal Me1, subsequently a layer of a fourth metal Me4, subsequently a layer of a second metal Me2 and subsequently a layer made of a third metal Me3 are applied. On the surface of the second component 2, a layer made of a first metal Me1, a layer of a fourth metal Me4, a layer made of a second metal Me2 and a layer made of a third metal Me3 are applied.

Subsequently, both components can be connected and subjected to a first temperature, in particular at most 180° C. or 200° C. In this case, the layers of the second and third metals Me2, Me3 can be brought into the liquid aggregate state and react with the layers of the fourth metal Me4 and the first metal Me1. A device 100 results which comprises a first phase 31, a second phase 32 and a first phase 31 as a layer sequence of the connecting element 3.

Figure 6B:
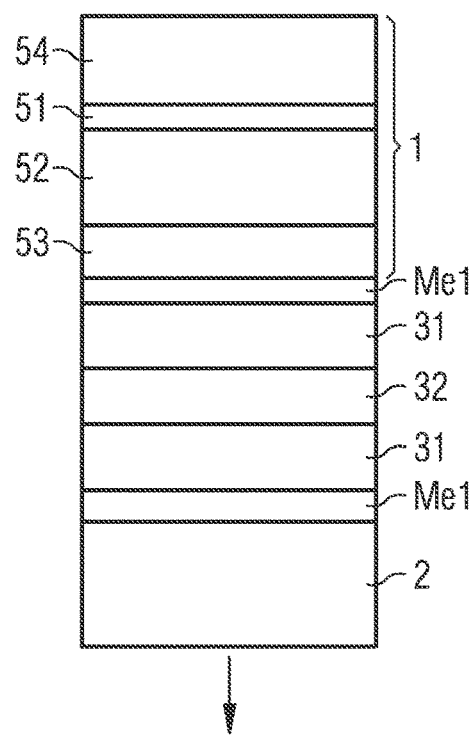

FIG. 6B shows that the first layer Me1, for example, after method step C), has not completely reacted with the second metal Me2 and/or third metal Me3 and/or fourth metal Me4.

By increasing the temperature, for example, to the second temperature, the system can react and the first metal layer Me1 can disappear on both sides. The result is a device 100 analogous to the device 100 of FIG. 2B, with the exception that there are no adhesive layers 4 between the connecting element 3 and the respective components 1, 2 in FIG. 6C.

Figure 7A:
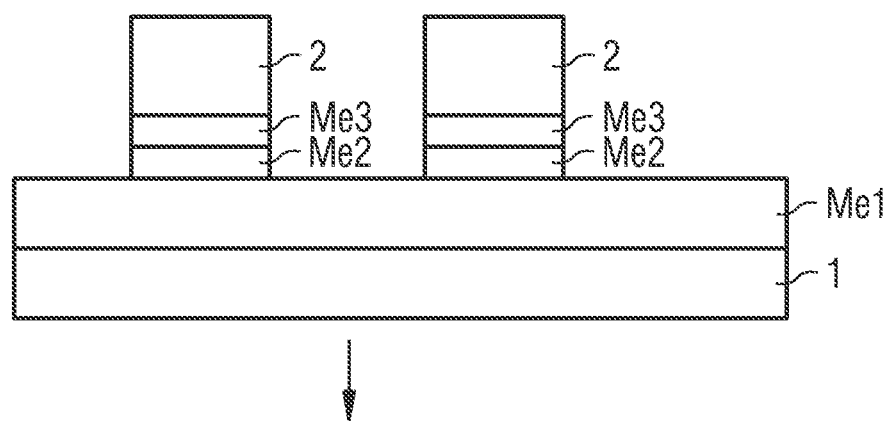
Figure 7B:
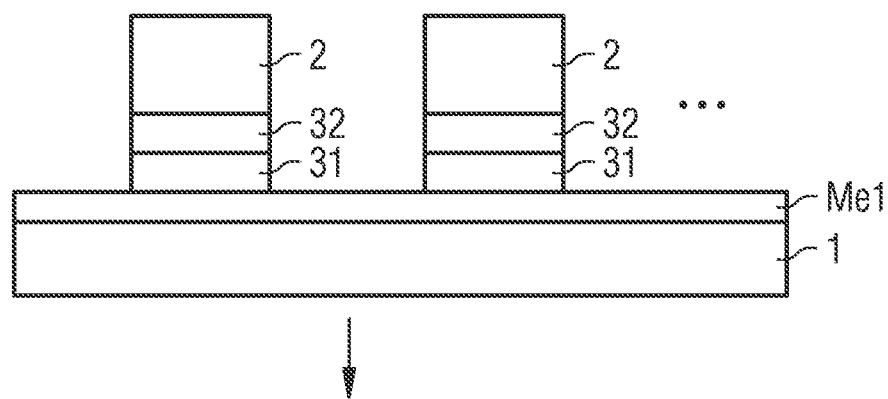
Figure 7C:
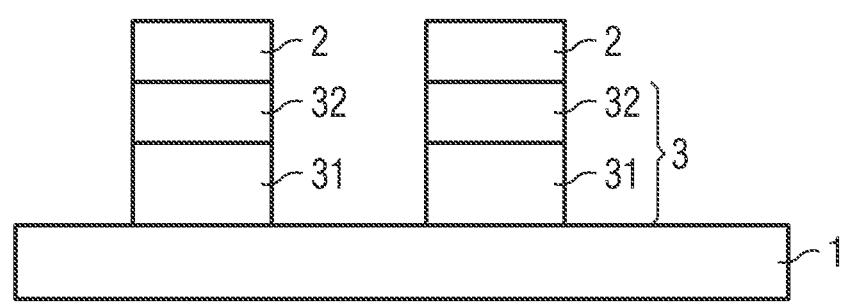

FIGS. 7A to 7C show a schematic side view of a device and the production thereof. In this embodiment, the first component 1 is formed by a carrier wafer 1. The carrier wafer is covered with a layer made of a first metal Me1. The first metal Me1 is, in particular, platinum, nickel or palladium and has a layer thickness of 65 nm. The layer of Me1 can be applied by means of cathode sputtering. At least two second components 2 are arranged on the layer of Me1. A layer made of a second metal Me2 and a layer made of a third metal Me3 are arranged between the at least two downstream components 2 (FIG. 7A). In other words, the device 100 illustrated in FIG. 7A has a first common component 1 and two second components 2.

The arrangement of FIG. 7A is subsequently treated at a first temperature of a maximum of 180° C. or 200° C. according to method step C). In this case, a connecting element is formed which has a first phase 31 and a second phase 32. The first phase 31 and the second phase 32 each have the first metal Me1, the second metal Me2 and the third metal Me3, or consist thereof (FIG. 7B). In a subsequent heating step, where the arrangement is exposed/heated to a second temperature between 230° C. and 400° C., a complete reaction of the connecting element 3 can be produced, so that the layer of the first metal Me1 completely disappears (FIG. 7C). The result is an arrangement which has a first component 1 and two second components 2, wherein in each case a first phase 31 and a second phase 32 are arranged between the two second components 2 and the first component 1, which are thermodynamically and mechanically stable.

Figure 8A:
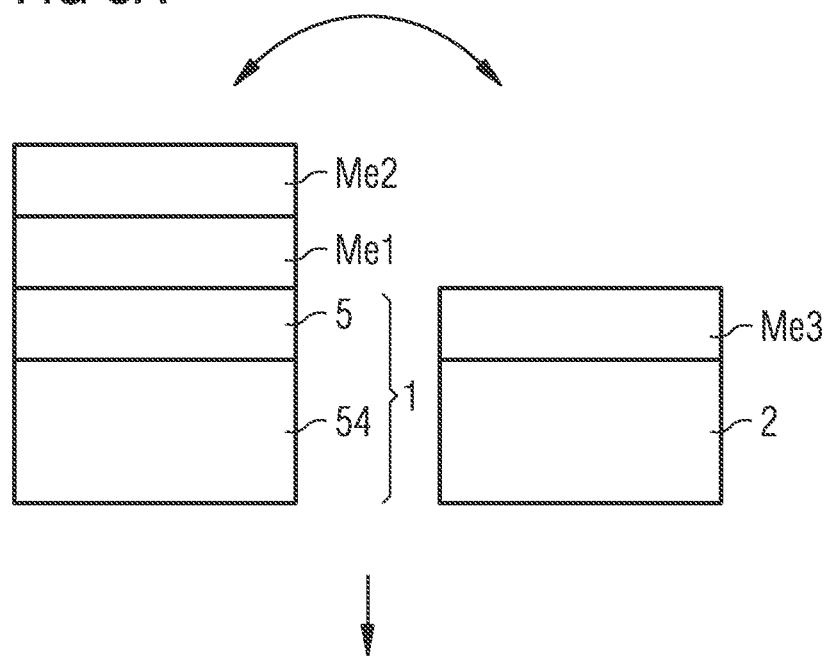
Figure 8B:
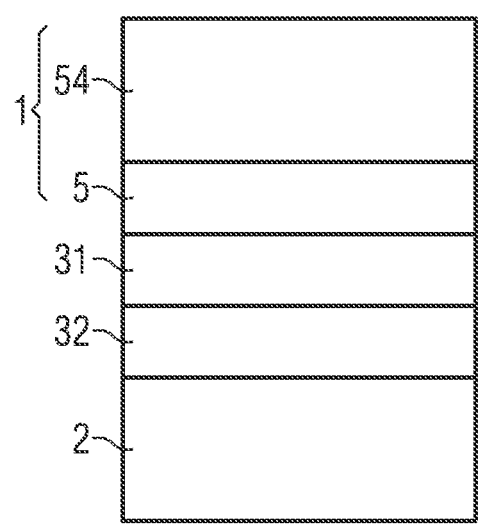

FIGS. 8A and 8B show the production of a device according to an embodiment. FIG. 8A shows the application of the first component, which comprises a semiconductor layer sequence 5 and a sapphire layer 54. Furthermore, the second component 2 can be provided. Subsequently, in each case at least one layer can be applied to the first component 1 or to the second component 2. In FIG. 8A it is shown that a layer of the first metal Me1 is applied on the first component 1 and subsequently a layer made of the second metal Me2 is applied. A layer made of a third metal Me3 is applied on the second component 2. Subsequently, the heating of the arrangement produced in method step B) is carried out to a maximum of 180° C., wherein the first component 1 and the second component 2 can be connected to one another. A connecting element 3 is formed which has a first phase 31 and a second phase 32. Each of the phases 31, 32 comprises the first metal Me1, the second metal Me2 and the third metal Me3 in different concentrations.

Two components 1, 2, for example, made of sapphire (6.1 μm/mK) and silicon nitride (1.2 μm/mK) are connected to one another as follows.

A layer made of a first metal Me1, for example, made of nickel, can be applied on the first component 1 comprising the sapphire. The layer thickness can be, for example, 450 nm. Subsequently, a layer made of the second metal Me2 is applied on this layer of the first metal Me1, for example, made of indium, which can have a layer thickness of 150 nm. A layer made of a first metal Me1, for example, made of nickel and having a layer thickness of 100 nm, can be applied on the second component 2, which comprises silicon nitride, together with a layer of a third metal Me3, for example, made of tin with a layer thickness of 700 nm, and with a layer of a second metal Me2, for example, made of indium having a layer thickness of 300 nm. In order to counteract the stress due to the different coefficients of thermal expansion, the first and the second component 1, 2, are heated to different temperatures before they are brought into contact. For example, the second component 2, which comprises the silicon nitride, can be heated to a temperature of 220° C. The first component 1, which comprises the sapphire, can be heated to a temperature of only 105° C. When the components 1, 2 are brought into contact, the warmer second component 2 heats the at least upper layer of the second metal Me2 of the first component 1, which leads to melting and thus triggers an isothermal solidification reaction. The first component 1 binds to the second component 2 or vice versa within a few seconds. The temperature difference of the individual components 1, 2 is thus frozen during the production. During cooling of the device or of the arrangement, a bending, which is considered harmless, is generated, in combination with a low processing temperature. In a subsequent step D) the arrangement can be heated to 240° C. and tempered for 10 minutes. In this case, the connecting element 3 can fully react, wherein the bow or bending at room temperature does not noticeably change.

During the soldering of a first component 1, which comprises, for example, an electronic chip having a surface area of 4 mm$^2$, to a second component, which comprises, for example, a leadframe, the difference in the thermal expansion behavior between the first component and the second component 1, 2 can lead to adhesion problems. In order to avoid this, the two components 1, 2 can be connected at temperatures which are as low as possible. The second component 2 comprising the leadframe can in this case be provided with a layer made of a first metal Me1, for example, platinum with a layer thickness of 350 nm, followed by a layer of a third metal Me3, for example, tin with a layer thickness of 450 nm, and followed by a layer of a second metal Me2, for example, indium with a layer thickness of 200 nm. The rear side metallization of an electronic chip generally consists of a first metal Me1, in particular platinum with a layer thickness of 150 nm, of a second metal Me2, for example, indium with a layer thickness of 300 nm, and a third metal Me3, for example, tin with a layer thickness of 150 nm. During the connection, the second component 2, which comprises the leadframe, is heated to a temperature of 135° C. The component 1, which, for example, comprises the electrical chip, is heated to a temperature of 145° C. The first and second components 1, 2 are then placed. The placing can be effected with a force of, for example, 6 N for a duration of 1.2 s. This results in a connection between the first and the second component 1, 2. The subsequent temperature step can be carried out at a temperature of more than 200° C., for example, at least 260° C., for 180 minutes.

Figure 9A:
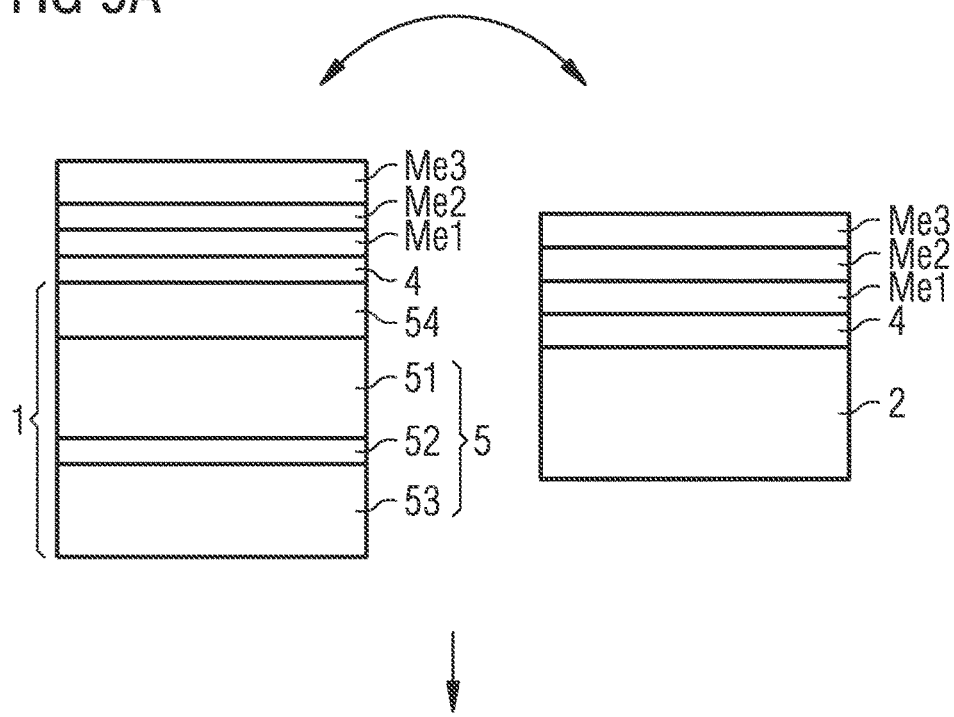
Figure 9B:
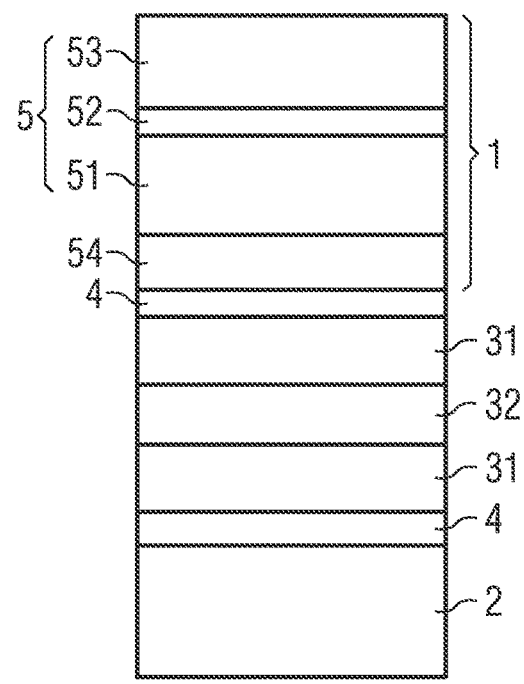

FIGS. 9A and 9B show a schematic side view of a method for producing a device according to an embodiment. FIG. 9A shows a first component 1, which comprises a semiconductor layer sequence 5 and a substrate 54, for example, made of sapphire. A layer made of a first metal Me1 is applied on said first component 1, for example, a nickel layer having a layer thickness of 150 nm. Subsequently, a layer of a second metal Me2, for example, an indium layer having a layer thickness of 170 nm, is applied. Subsequently, a layer made of a third metal Me3, for example, a tin layer having a layer thickness of 250 nm, is applied. An adhesive layer can optionally be arranged between the layer of the first metal Me1 and the first component 1. Alternatively, the semiconductor layer sequence 5 comprising the p-type semiconductor layer 53, the active layer 52 and the n-type semiconductor layer 51 and subsequently the substrate 54 can be arranged in a subordinate manner after the adhesive layer 4.

Furthermore, a second component, for example, made of quartz glass, is provided.

The second component 2 can subsequently comprise a layer made of a first metal Me1, for example, a nickel layer having a layer thickness of 150 nm. Subsequently, a layer of a second metal Me2, for example, an indium layer having a layer thickness of 170 nm, can be applied. Subsequently, a layer of a third metal Me3, for example, a tin layer having a layer thickness of 250 nm, can be applied. An adhesive layer can optionally be arranged between the layer of the first metal Me1 and the first component 1.

Subsequently, the temperature control and/or connection of the components 1, 2 is carried out, for example, at a temperature of 142° C. and/or a pressure of 1 MPa, so that a device 100 results which has the following layer sequence between the first and second components 1, 2: first component 1, (adhesive layer 4), first phase 31, second phase 32, first phase 31, (adhesive layer 4), second component 2.

In order to connect or bond the components 1, 2 as smoothly as possible, these are initially placed on top of one another and heated in this state at a heating rate of 10 K/min, starting from room temperature, to the temperature used for bonding. Only then the pressure can be applied. In particular, the pressure is kept at 120 sec. Subsequently, the components 1, 2 can be cooled down to room temperature again at a cooling ramp of 10 K/min. In order to completely generate the connecting element, the device is heated to a temperature of 230° C. in a subsequent step D, so that the metals of the connecting element completely react. In particular, this temperature is kept for 120 minutes. This results in a device according to FIG. 9B. The device of FIG. 9B corresponds to the device of FIG. 2B. The device 100 of FIGS. 9A and 9B can have further metals, for example, a fourth metal Me4.

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention comprises any new feature and any novel combination of features, which includes in particular any combination of features in the patent claims, even if this feature or this combination itself is not explicitly specified in the patent claims or exemplary embodiments.

The invention claimed is:
1. A device comprising:
a first component;
a second component; and
a connecting element arranged between the first component and the second component,
wherein the connecting element comprises at least a first phase and a second phase,
wherein the first phase comprises a first metal having a first concentration (c11), a second metal having a second concentration (c12) and a third metal having a third concentration (c13), wherein the second phase comprises the first metal having a fourth concentration (c25), the second metal and the third metal, wherein the first metal, the second metal and the third metal are different from one another and are suitable for reacting at a processing temperature of less than 200° C., and wherein the following applies: c11≥c25 and c11≥c13≥c12.

2. The device according to claim 1, wherein in the second phase the second metal has a fifth concentration (c26) and the third metal has a sixth concentration (c27), wherein the following applies: c11>c25 and c11>c13>c12 and c12<c26 or c11>c25 and c11>c13>c12 and c25=c27>c26.

3. The device according to claim 1, wherein the first metal is selected from the group consisting of nickel, platinum and palladium.

4. The device according to claim 1, wherein the second metal is indium and the third metal is tin.

5. The device according to claim 1, wherein the first concentration of the first metal in the first phase is between 40 and 65 atom % and/or the fourth concentration of the first metal in the second phase is between 20 and 40 atom %.

6. The device according to claim 1, wherein the second concentration of the second metal in the first phase is between 5 and 25 atom % and/or a fifth concentration of the second metal in the second phase is between 20 and 40 atom %.

7. The device according to claim 1, wherein the third concentration of the third metal in the first phase is between 15 and 40 atom % and/or a sixth concentration of the third metal in the second phase is between 30 and 50 atom %.

8. The device according to claim 1, wherein the second component comprises a light-emitting diode, and wherein at least the first component is selected from a group consisting of sapphire, silicon nitride, a semiconductor material, a ceramic material, a metal and glass.

9. The device according to claim 1, wherein the first metal has a melting point of greater than 1400° C., the second metal has a melting point of less than 180° C. and the third metal has a melting point of less than 250° C., and wherein the second and the third metal form a eutectic mixture at a melting point of less than or equal to 120° C.

10. The device according to claim 1, wherein the first phase further comprises a fourth metal having a seventh concentration and/or the second phase comprises the fourth metal with a eighth concentration, wherein the fourth metal has a melting point of less than 1200° C. and the concentration of the fourth metal in the first phase and/or the second phase is the smallest concentration of all metals.

11. The device according to claim 10, wherein the fourth metal is gold.

12. The device according to claim 10, wherein the seventh concentration of the fourth metal in the first phase and/or the eighth concentration of the fourth metal in the second phase has a maximum of 5 atom %.

13. The device according to claim 1, wherein the first phase and the second phase are each formed as a layer and are arranged in direct contact with one another, wherein the layers of the first and second phases are stacked one on top of the other such that the first phase of the first component and the second phase of the second component are facing each other.

14. The device according to claim 1, wherein the first component has a first coefficient of thermal expansion and the second component has a second coefficient of thermal expansion, and wherein the first coefficient of thermal expansion differs from the second coefficient of thermal expansion by at least a factor of 1.5.

15. A method for producing the device according to claim 1, the method comprising:
providing the first component and the second component;
applying a layer of the first metal, a layer of the second metal and a layer of the third metal onto the first component and/or the second component thereby forming a first arrangement;
heating the first arrangement at a maximum of 200° C. in order to form the connecting element having the first phase and the second phase, wherein the first phase and the second phase each contain the first metal, the second metal and the third metal thereby forming a second arrangement; and
heating the second arrangement to a temperature of between 200° C. and 400° C. for forming a thermodynamically and mechanically stable first and second phase,
wherein at least before heating the second arrangement, the first and second components are connected to one another,
wherein the first phase comprises, at least after heating the second arrangement, the first metal having the first concentration (c11), the second metal having the second concentration (c12) and the third metal having the third concentration (c13),
wherein the second phase comprises the first metal having the fourth concentration (c25), the second metal having a fifth concentration and the third metal having a sixth concentration, and
wherein: c11≥c25 and c11≥c13≥c12.

16. The method according to claim 15, wherein the connecting element in the first arrangement forms a fixed connection to the first component and the second component.

* * * * *